(12) United States Patent
Iwasaki et al.

(10) Patent No.: US 6,720,237 B2
(45) Date of Patent: Apr. 13, 2004

(54) METHOD FOR MANUFACTURING A SEMICONDUCTOR FILM

(75) Inventors: Yukiko Iwasaki, Kyoto (JP); Tatsumi Shoji, Kanagawa (JP); Shoji Nishida, Nara (JP)

(73) Assignee: Canon Kabushiki Kaisha, Tokyo (JP)

( * ) Notice: Subject to any disclaimer, the term of this patent is extended or adjusted under 35 U.S.C. 154(b) by 23 days.

(21) Appl. No.: 10/083,585

(22) Filed: Feb. 27, 2002

(65) Prior Publication Data

US 2002/0132449 A1 Sep. 19, 2002

(30) Foreign Application Priority Data

Mar. 16, 2001 (JP) ........................................ 2001-076284
Feb. 6, 2002 (JP) ........................................ 2002-029299

(51) Int. Cl.[7] .......................... H01L 21/30; H01L 21/46

(52) U.S. Cl. ...................................................... 438/458

(58) Field of Search ........................... 438/406, 455–459

(56) References Cited

U.S. PATENT DOCUMENTS

| 5,856,229 | A | | 1/1999 | Sakaguchi et al. | .......... 438/406 |
| 6,054,363 | A | | 4/2000 | Sakaguchi et al. | .......... 438/406 |
| 6,222,167 | B1 | * | 4/2001 | Wada et al. | ................. 219/645 |
| 6,258,702 | B1 | | 7/2001 | Nakagawa et al. | ......... 438/570 |
| 6,274,937 | B1 | * | 8/2001 | Ahn et al. | ................... 257/777 |
| 6,486,008 | B1 | * | 11/2002 | Lee | ............................. 438/149 |
| 6,548,382 | B1 | * | 4/2003 | Henley et al. | .............. 438/526 |

* cited by examiner

*Primary Examiner*—Evan Pert
*Assistant Examiner*—Asok Kumar Sarkar
(74) *Attorney, Agent, or Firm*—Fitzpatrick, Cella, Harper & Scinto (57) ABSTRACT

A method for manufacturing a semiconductor film includes a step of preparing a first member including a semiconductor substrate, a semiconductor layer, and a separation layer provided between the semiconductor substrate and the semiconductor layer, a step of bonding or attracting a second member which is hardly heated by induction heating, onto the semiconductor layer of the first member, and a step of separating semiconductor layer from the semiconductor substrate at the separation layer by heating the semiconductor substrate by induction heating.

3 Claims, 6 Drawing Sheets

METHOD FOR MANUFACTURING A SEMICONDUCTOR FILM

BACKGROUND OF THE INVENTION

1. Field of the Invention

The present invention relates to a method for manufacturing a semiconductor film, and more particularly, to a method for manufacturing a semiconductor film which is suitable for use as a solar cell or a silicon-on-insulator (SOI) substrate.

2. Description of the Related Art

Recently, a technique for manufacturing an SOI substrate has been attracting notice as a technique for improving the processing speed of a semiconductor device and allowing saving of electric power. The SOI substrate is obtained by forming a semiconductor film having a thickness of about several tens of nm to a few µm, for example, a single-crystal silicon film, on an insulating layer. Methods for inexpensively manufacturing a solar cell using such a thin semiconductor film have also been proposed.

U.S. Pat. No. 5,856,229 describes a method for manufacturing such an SOI substrate. In this method, first, a first substrate (wafer) comprising nonporous single-crystal silicon is prepared, and a porous silicon layer is formed by anodizing a surface of the first substrate. Then, a nonporous single-crystal silicon layer is formed on the porous silicon layer according to epitaxial growth. An insulating layer comprising silicon oxide is formed by oxidizing the surface of the nonporous single-crystal silicon layer, and a multilayer structure is formed by bonding a second substrate on the surface of the insulating layer. Then, an SOI substrate is manufactured by separating the nonporous single-crystal silicon layer from the first substrate at the porous silicon layer by applying an external force, such as a tensile force or the like, to the multilayer structure, and transferring the nonporous single-crystal silicon layer onto the second substrate via the insulating layer.

U.S. Pat. No. 6,054,363 describes another method for manufacturing an SOI substrate. In this method, the same processing as described above is performed until a multilayer structure is formed. After this processing, the nonporous single-crystal silicon layer is separated from the first substrate by applying an abrupt thermal stress to the porous silicon layer, by heating the nonporous single-crystal silicon layer by causing a current to flow only therein.

SUMMARY OF THE INVENTION

It is an object of the present invention to provide a method for manufacturing a semiconductor film more simply and efficiently by improving the above-described conventional methods.

According to one aspect of the present invention, a method for manufacturing a semiconductor film includes the steps of preparing a first member including a semiconductor substrate, a semiconductor layer, and a separation layer provided between the semiconductor substrate and the semiconductor layer, bonding or attracting a second member which is hardly heated by induction heating, onto the semiconductor layer of the first member, and separating the semiconductor layer from the semiconductor substrate at the separation layer by heating the semiconductor substrate by induction heating.

According to another aspect of the present invention, a method for manufacturing a semiconductor film includes the steps of preparing a first member including a semiconductor substrate, a semiconductor layer, and a separation layer provided between the semiconductor substrate and the semiconductor layer, bonding or attracting a second member whose resistivity is higher than a resistivity of the semiconductor substrate, onto the semiconductor layer of the first member, and separating the semiconductor layer from the semiconductor substrate at the separation layer by heating the semiconductor substrate by induction heating.

According to still another aspect of the present invention, a method for manufacturing a semiconductor film includes the steps of preparing a first member including a semiconductor substrate, a semiconductor layer whose resistivity is higher than a resistivity of the semiconductor substrate, and a separation layer provided between the semiconductor substrate and the semiconductor layer, and separating the semiconductor layer from the semiconductor substrate at the separation layer by heating the first member by induction heating. It is desirable that the resistivity of the semiconductor layer is at least 10 times the resistivity of the semiconductor substrate. It is desirable that the resistivity of the semiconductor layer is at least 1 Ω·cm, and the resistivity of the semiconductor substrate is equal to or less than 0.1 Ω·cm.

In the present invention, the first member is prepared by a step of forming a porous silicon layer, serving as a separation layer, by anodizing a surface of a nonporous silicon substrate, and a step of forming a nonporous silicon layer on the porous silicon layer according to epitaxial growth. (3) The first member may also be prepared by a step of forming an ion-implanted layer, serving as a separation layer, except for a silicon layer where ions are not implanted on a surface thereof, by implanting at least one type of ions selected from hydrogen, nitrogen and helium to a predetermined depth from a surface of a silicon substrate. In this process, a protective film may be formed on the surface of the silicon substrate before implanting the ions.

In the present invention, the step of heating the semiconductor substrate by induction heating is performed by mounting the bonded or attracted first and second members on an induction-heating mount around which a coil is wound, and causing a current to flow in the semiconductor substrate by supplying the coil with a high-frequency current. Slits may be formed in the separation layer before heating the semiconductor substrate by induction heating. A tensile force, a compressive force or a shearing force may be applied simultaneously with the induction heating. A pressure or a hydrostatic pressure by a fluid may be applied to the separation layer simultaneously with the induction heating. The second member may be cooled simultaneously with the induction heating.

After separating the semiconductor layer, a residue of the separation layer remaining on the semiconductor layer is removed according to etching, if necessary. After separating the semiconductor layer, a remaining semiconductor substrate may be reutilized for preparing another first member. At that time, a residue of the separation layer remaining on the semiconductor substrate may be removed according to etching, if necessary.

According to yet another aspect of the present invention, a method for manufacturing a solar cell includes the steps of forming a porous silicon layer by anodizing a surface of a $p^+$-type nonporous silicon substrate, sequentially forming a $p^-$-type nonporous silicon layer and an $n^+$-type nonporous silicon layer on the porous silicon layer according to epitaxial growth, attracting an attraction mount which is hardly heated by induction heating, on the n⁺-type nonporous silicon layer, separating the p⁻-type and n⁺-type nonporous silicon layers from the p⁺-type nonporous silicon substrate at the porous silicon layer by heating the p⁺-type nonporous silicon substrate by induction heating, and forming electrodes on the separated p⁻-type and n⁺-type nonporous silicon layer.

According to yet a further aspect of the present invention, a method for manufacturing an SOI substrate includes the steps of forming a porous silicon layer by anodizing a surface of a p⁺-type nonporous silicon substrate, forming a p⁻-type nonporous silicon layer on the porous silicon layer according to epitaxial growth, forming a silicon-oxide layer on a surface of the p⁻-type nonporous silicon layer, forming a multilayer structure by bonding another nonporous silicon substrate on a surface of the silicon-oxide layer, and separating the p⁻-type nonporous silicon layer from the p⁺-type nonporous silicon substrate at the porous silicon layer by heating the multilayer structure by induction heating.

The foregoing and other objects, advantages and features of the present invention will become more apparent from the following description of the preferred embodiments taken in conjunction with the accompanying drawings.

DETAILED DESCRIPTION OF THE PREFERRED EMBODIMENTS

Figure 1A:
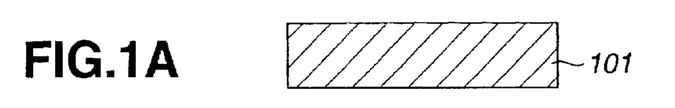
FIGS. 1A–1F are schematic cross-sectional views illustrating a method for manufacturing a semiconductor film according to a first embodiment of the present invention.

FIGS. 1A–1F are schematic cross-sectional views illustrating a method for manufacturing a semiconductor film according to a first embodiment of the present invention. In order to manufacture a semiconductor film, first, as shown in FIG. 1A, a nonporous single-crystal silicon substrate 101 is prepared as a semiconductor substrate. A low-resistivity material which can be heated by induction heating, such as p⁺-type silicon or n⁺-type silicon, is desirable as the nonporous single-crystal silicon substrate 101.

Figure 1B:
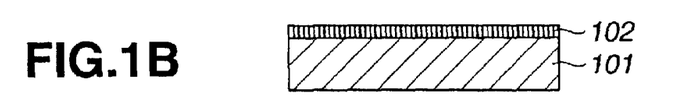

Then, as shown in FIG. 1B, a porous silicon layer 102 is formed on a surface of the nonporous single-crystal silicon substrate 101 by anodizing the nonporous single-crystal silicon substrate 101. The porous silicon layer 102 operates as a separation layer. A hydrogen-fluoride (HF) solution or a solution obtained by mixing alcohol with this solution may be used as an anodization solution. At that time, by changing the anodization solution or the current density during anodization, the porous silicon layer 102 may be formed in a multilayer structure in which a plurality of layers having different porosities are laminated in the direction of the thickness. By thus providing a layer having a high porosity in a part of the multilayer structure, it is easy to perform separation or to control a portion to be separated.

Figure 1C:
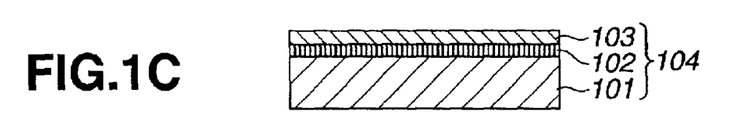

Then, as shown in FIG. 1C, a nonporous single-crystal silicon layer 103 is formed on the porous silicon layer 102 according to epitaxial growth. The nonporous single-crystal silicon layer 103 may be formed according to chemical vapor deposition (CVD), liquid deposition or the like. A p⁻-type silicon layer whose resistivity is higher than the resistivity of the nonporous single-crystal silicon substrate 101 is desirable as the nonporous single-crystal silicon layer 103. The nonporous single-crystal silicon layer 103 may include a plurality of layers having different conduction types or compositions. The above-described structure in which the nonporous single-crystal silicon layer 103 is formed on the nonporous single-crystal silicon substrate 101 via the porous silicon layer 102 operates as a first member 104.

Before forming the nonporous single-crystal silicon layer 103 in the above-described manner, an oxide film may be formed on the inner walls of pores in the porous silicon layer 102, followed by annealing in a reductive atmosphere including hydrogen. By such annealing, silicon atoms on the surface of the porous silicon layer 102 move to reduce the sizes of the pores. As a result, defects in the nonporous single-crystal silicon layer 103 growing on the porous silicon layer 102 can be reduced. The oxide film is formed in advance on the inner walls of pores in order to prevent silicon atoms from moving within the pores to close the pores. As a result, when removing a residue of the porous silicon layer 102 by etching as will be described later, the residue can be more easily removed.

A method for forming oxide films on both of the inner walls of pores and the surface of the porous silicon layer 102 by performing heat treatment of the porous silicon layer 102, for example, in an oxygen atmosphere may be used as the method for forming an oxide film only in the inner walls of pores of the porous silicon layer 102 as described above. Thereafter, by processing the surface of the porous silicon layer 102 with a hydrogen-fluoride (HF) solution, only the oxide layer on the surface of the porous silicon layer 102 can be removed while leaving the oxide film on the inner walls of pores.

Figure 1D:
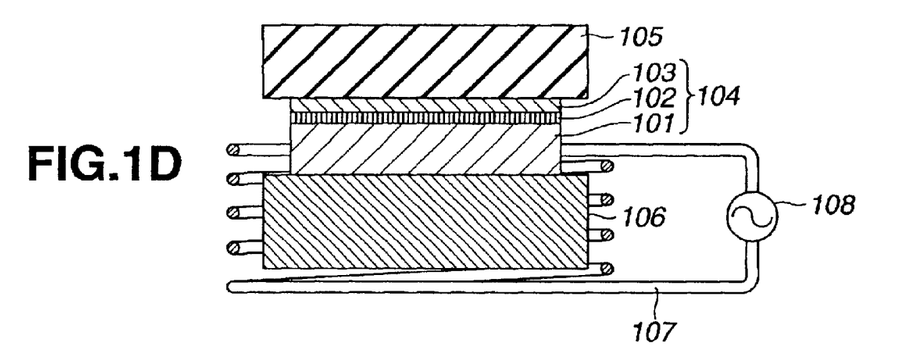

Then, as shown in FIG. 1D, after attracting the surface of the nonporous single-crystal silicon layer 103 of the first member 104 onto an attraction mount 105, the first member 104 attracted on the attraction mount 105 is mounted on an induction-heating mount 106. A heating coil 107 is wound around the induction-heating mount 106. A high-frequency current is caused to flow in the heating coil from an AC power supply 108. The attraction mount 105 is made of a material which is hardly heated by induction heating, i.e., a material which is substantially not heated by induction heating. A high-resistivity material, such as alumina, Photoveel (the trade name of a product made by Sumikin Ceramics Co., Ltd.), Macor (the trade name of a product made by Corning Incorporated) or the like, may preferably be used as such a material. That is, the attraction mount 105 operates as a second member. Although in the first embodiment, the silicon substrate 101 faces the induction heating mount 106, the attraction mount 105 may face the induction-heating mount 106.

The attraction mount 105 is provided in order to generate a temperature difference with respect to the silicon substrate 101. Accordingly, the attraction mount 105 has a resistivity higher than the resistivity of the silicon substrate 101. The temperature difference with respect to the silicon substrate 101 may be increased by providing a pipe (not shown) within the attraction mount 105 and causing water, or cooled nitrogen gas, helium gas or the like to flow in the pipe, i.e., by providing a cooling mechanism within the attraction mount 105.

Instead of the above-described attraction mount 105, a member to be bonded on the surface of the nonporous single-crystal silicon layer 103 may also be used. For example, when manufacturing an SOI substrate, the nonporous single-crystal silicon layer 103 is bonded on a supporting substrate before being separated from the silicon substrate 101. In this case, the supporting member operates as the second member. A single-crystal silicon substrate manufactured according to a Czochralski (CZ) method, a single-crystal silicon substrate manufactured according to a floating-zone (FZ) method, a single-crystal silicon substrate subjected to hydrogen annealing, a transparent glass substrate, or the like may be used as the supporting member.

When using the supporting member as the second member in the above-described manner, the resistivity of the supporting member must be higher than the resistivity of the silicon substrate 101. Furthermore, the supporting member is preferably made of a material which is substantially not heated by induction heating, i.e., a material which is hardly heated by induction heating. It is desirable that the resistivity of the supporting member is at least 1 Ω·cm, preferably, at least 10 Ω·cm, and more preferably, at least 100 Ω·cm.

When using a silicon substrate as the supporting substrate, the supporting member may be bonded on nonporous single-crystal layer 103 via an insulating layer. At that time, the insulating layer may be formed on the surface of the nonporous single-crystal silicon layer 103, or may be formed on both the surface of the nonporous single-crystal silicon layer 103 and the surface of the silicon substrate. For example, silicon-oxide layers formed by performing thermal oxidation of the surface of the nonporous single-crystal silicon layer 103 and the surface of the silicon substrate are used as such insulating layers.

Figure 1E:
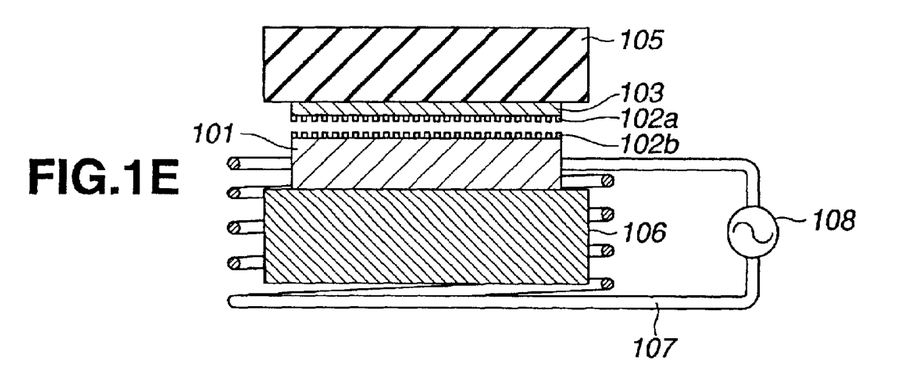

Then, as shown in FIG. 1E, the silicon substrate 101 is heated by induction heating by causing a high-frequency current to flow in the heating coil 107 wound around the induction-heating mount 106 from the AC power supply 108. At that time, since the attraction mount 105 is hardly heated, a temperature difference is provided between the silicon substrate 101 and the attraction mount 105. Although it depends on the porosity of the porous silicon layer 102, the thermal conductivity of the porous silicon layer 102 is usually lower than the thermal conductivity of the silicon substrate 101, and a temperature distribution (difference or gradient) is produced starting from the porous silicon layer 102, i.e., the separation layer. Due to this temperature difference, a thermal stress is applied to the porous silicon layer 102. As a result, cracks are produced in the porous silicon layer 102, resulting in separation of the nonporous single-crystal silicon layer 103 from the silicon substrate 101. That is, the nonporous single-crystal silicon layer 103 is separated from the silicon substrate at the porous silicon layer 102. In order to realize such separation, the above-described temperature difference is desirably at least 500° C.

Before performing induction heating as shown in FIG. 1E, slits may be provided at sides of the porous silicon layer 102. Furthermore, a tensile force, a compressive force or a shearing force may be applied to the porous silicon layer 102 by a suitable expedient as a separation assist simultaneously with the induction heating. Furthermore, a pressure or a hydrostatic pressure exerted by a fluid may also be applied to the porous silicon layer 102 simultaneously with the induction heating. Since the structure of the porous silicon layer 102 is more fragile than the silicon substrate 101 and the nonporous single-crystal silicon layer 103, separation can be accelerated by applying such an external force.

As shown in FIG. 1E, a residue 102a of the porous silicon layer 102 sometimes remains on the separated nonporous single-crystal silicon layer 103. In such a case, the residue 102a may be removed by etching, if necessary. In addition, a residue 102b of the porous silicon layer 102 also sometimes remains on the silicon substrate 101 from which the nonporous single-crystal silicon layer 103 has been separated. Such a residue 102b may also be removed by etching, if necessary.

Figure 1F:
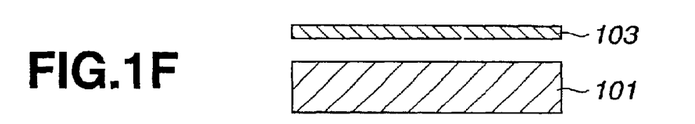

Thus, as shown in FIG. 1F, the nonporous single-crystal silicon layer 103 and the silicon substrate 101 are obtained. The nonporous single-crystal silicon layer 103 is used, for example, for manufacturing a semiconductor device, such as a solar cell or the like. On the other hand, the silicon substrate 101 can be reutilized for preparing another first member. That is, by using the silicon substrate 101 shown in FIG. 1F, another nonporous single-crystal silicon layer 103 can again be manufactured according to the processing shown in FIGS. 1A–1E.

The principle of induction heating will now be briefly described. A substance to be heated, comprising a metal or a low-resistivity material, is disposed within a winding made of a conductive pipe (mainly made of copper) called a heating coil. By causing a high-frequency current to flow in the heating coil, high-frequency magnetic fluxes are generated to cause an eddy current to flow in the substance to be heated, and the temperature rises due to the Joule heating. This operation is called induction heating, and has features such that, for example, rapid heating can be performed, the running cost is low, and localized heating can be performed.

When performing induction heating in the present invention, selective heating of the silicon substrate 101 is an important point. Accordingly, the resistivity of the silicon substrate 101 is preferably equal to or less than 0.1 Ω·cm, and more preferably, equal to or less than 0.05 Ω·cm. In order to provide an effective temperature difference, it is desirable that the resistivity of the nonporous single-crystal silicon layer 103 is at least 1 Ω·cm. However, in the first embodiment, the nonporous single-crystal silicon layer 103 is attracted or bonded on the attraction mount 106, which is hardly heated by induction heating, and the heat of the nonporous single-crystal silicon substrate 103 is transmitted to the attraction mount 106. Hence, the nonporous single-crystal silicon layer 103 need not always have the above-described high resistivity. That is, although it has been described that the nonporous single-crystal silicon layer 103 desirably comprises p$^-$-type silicon whose resistivity is higher than the resistivity of the silicon substrate 101, the nonporous single-crystal silicon layer 103 may comprise non-doped silicon, p$^+$-type silicon, n$^-$-type silicon or n$^+$-type silicon in accordance with the desired semiconductor film.

FIGS. 2A–2F are schematic cross-sectional views illustrating a method for manufacturing a semiconductor film according to a second embodiment of the present invention. In FIGS. 2A–2F, the same components as those in FIGS. 1A–1F are indicated by the same reference numerals, and further description thereof will be omitted.

Figure 2A:
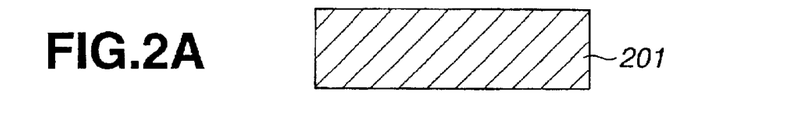
FIGS. 2A–2F are schematic cross-sectional views illustrating a method for manufacturing a semiconductor film according to a second embodiment of the present invention.

In the second embodiment, first, as shown in FIG. 2A, a nonporous single-crystal silicon substrate 201 is prepared.

Figure 2B:
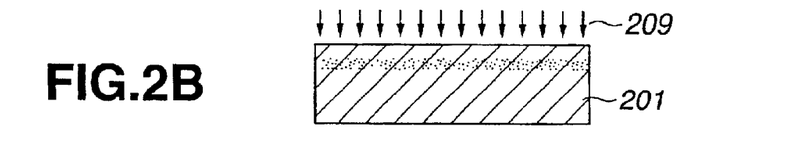

Then, as shown in FIG. 2B, ions 209 of at least one type selected from rare gases, such as hydrogen, nitrogen, helium and the like, are implanted to a predetermined depth from the surface of the silicon substrate 201. At that time, before implanting ions, it is preferable to form a protective layer comprising a silicon-oxide layer or the like on the surface of the silicon substrate 201.

Figure 2C:
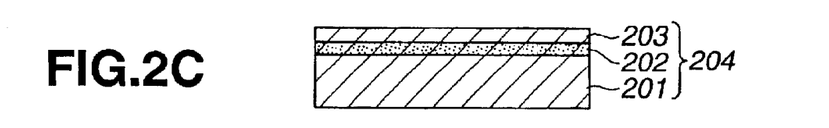

By the ion implantation, as shown in FIG. 2C, an ion-implanted layer 202 is formed except for a silicon layer 203 where ions are not implanted on the surface thereof. The ion-implanted layer 202 operates as a separation layer. A structure in which the silicon layer 203 is formed on the silicon substrate 201 via the ion-implanted layer 202 in the above-described manner serves as a first member 204.

Figure 2D:
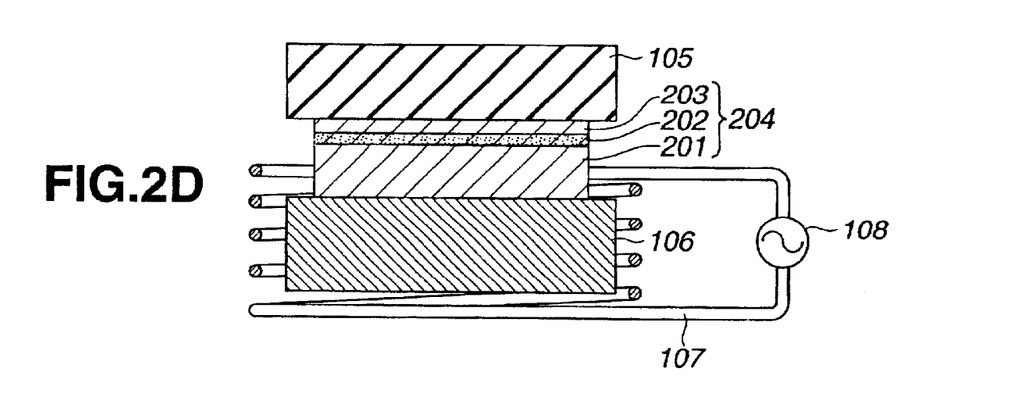
Figure 2E:
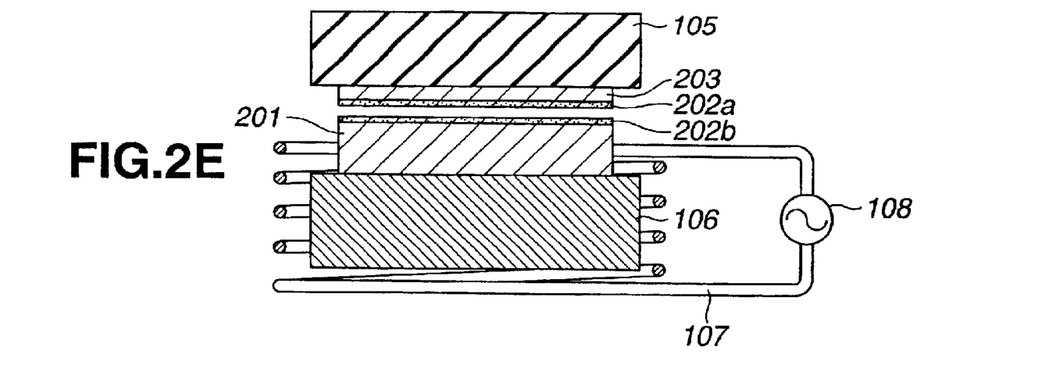

Then, as shown in FIG. 2D, after attracting the surface of the silicon layer 203 of the first member 204 onto an attraction mount 105, the first member 204 attracted on the attraction mount 105 is mounted on an induction-heating mount 106. Then, as shown in FIG. 2E, the silicon substrate 201 is heated by induction heating by causing a high-frequency current to flow in a heating coil 107 wound around the induction-heating mount 106 from an AC power supply 108. Since defects and distortion are concentrated in the ion-implanted layer 202, very small bubbles agglomerate under the effect of heating at 400–600° C. On the other hand, since the attraction mount 105 is hardly heated, a temperature difference is provided between the silicon substrate 101 and the attraction mount 105, and a temperature distribution is provided starting from the ion-implanted layer 202, i.e., the separation layer. Due to this temperature difference, a thermal stress is applied to the ion-implanted layer 202. As a result, cracks are produced in the ion-implanted layer 202, to separate the silicon layer 203 from the silicon substrate 201.

As shown in FIG. 2E, a residue 202a of the ion-implanted layer 202 sometimes remain on the separated silicon layer 203. In such a case, the residue 202a may be removed by etching, if necessary. In addition, a residue 202b of the ion-implanted layer 202 also sometimes remains on the silicon substrate 201 from which the silicon layer 203 has been separated. Such a residue 202b may also be removed by etching, if necessary. The residue 202a or 202b may be removed not only by etching, but also, for example, by smoothing the surface of the silicon layer 203 or the silicon substrate 201, respectively, by performing annealing after grinding the surface.

Figure 2F:
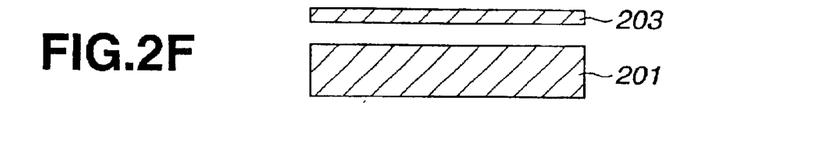

Thus, as shown in FIG. 2F, the silicon layer 203 and the silicon substrate 201 are obtained. The silicon layer 203 is used, for example, for manufacturing a semiconductor device, such as a solar cell or the like. On the other hand, the silicon substrate 201 can be reutilized for preparing another first member. That is, by using the silicon substrate 201 shown in FIG. 2F, the silicon layer 203 can again be manufactured according to the processing shown in FIGS. 2A–2E.

FIGS. 3A–3F are schematic cross-sectional views illustrating a method for manufacturing a semiconductor film according to a third embodiment of the present invention. In the third embodiment, a semiconductor layer is separated from a semiconductor substrate by utilizing a difference in the resistivity between the semiconductor substrate and the semiconductor layer. In FIGS. 3A–3F, the same components as those in FIGS. 1A–1F are indicated by the same reference numerals, and further description thereof will be omitted.

Figure 3A:
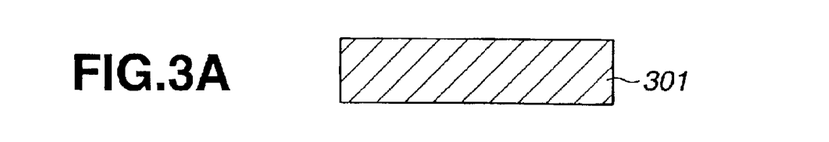
FIGS. 3A–3F are schematic cross-sectional views illustrating a method for manufacturing a semiconductor film according to a third embodiment of the present invention.

In the third embodiment, first, as shown in FIG. 3A, a nonporous single-crystal silicon substrate 101 having a first resistivity is prepared as a semiconductor substrate. In order to be sufficiently heated by induction heating, the first resistivity is preferably equal to or less than 0.1 Ω·cm, and more preferably, equal to or less than 0.05 Ω·cm. A material comprising, for example, $p^+$-type silicon or $n^+$-type silicon, may be preferably used as the silicon substrate 101.

Figure 3B:
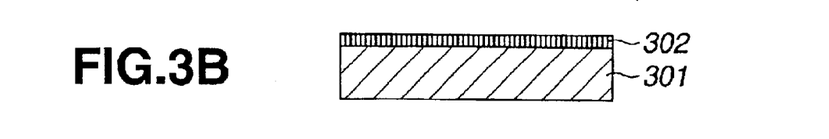

Then, as shown in FIG. 3B, a porous silicon layer 302 is formed on a surface of the nonporous single-crystal silicon substrate 101 by anodizing the nonporous single-crystal silicon substrate 301. The porous silicon layer 302 operates as a separation layer.

Figure 3C:
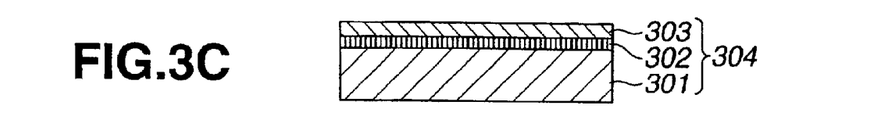

Then, as shown in FIG. 3C, a nonporous single-crystal silicon layer 303 having a second resistivity is formed on the porous silicon layer 302 according to epitaxial growth. The above-described structure in which the nonporous single-crystal silicon layer 303 is formed on the silicon substrate 301 via the porous silicon layer 202 operates as a first member 304.

The second resistivity is higher than the first resistivity, i.e., the resistivity of the silicon substrate 301. The second resistivity is preferably at least 10 times, and more preferably, at least 100 times higher than the first resistivity. It is desirable that the second resistivity is at least 1 Ω·cm. More specifically, the nonporous single-crystal silicon layer 303 comprises, for example, non-doped silicon, $p^-$-type silicon or $n^-$-type silicon. In this description, $p^+$-type silicon or $n^+$-type silicon has an impurity concentration equal to or more than $10^{17}$ atoms/cm$^3$, and $p^-$-type silicon or $n^-$-type silicon has an impurity concentration equal to or less than $10^{16}$ atoms/cm$^3$. Usually, the resistivity of $p^+$-type silicon or $n^+$-type silicon is at least 0.1 Ω·cm, and the resistivity of $p^-$-type silicon or $n^-$-type silicon is at least 1 Ω·cm.

Figure 3D:
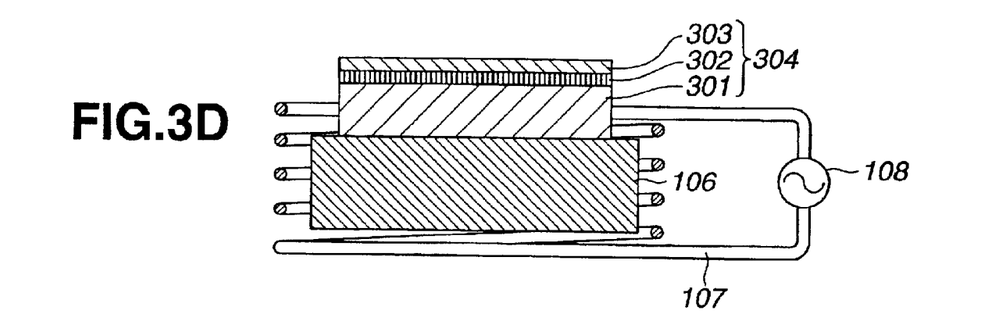

Then, as shown in FIG. 3D, the first member 304 is mounted on an induction heating mount 106. Although in the third embodiment, the silicon substrate 101 faces the induction-heating mount 106, the nonporous single-crystal silicon layer 303 may face the induction-heating mount 106.

Figure 3E:
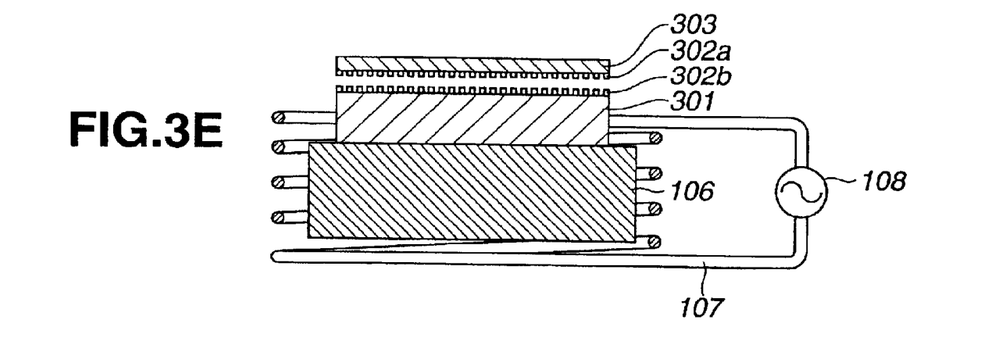

Then, as shown in FIG. 3E, the silicon substrate 101 is heated by induction heating by causing a high-frequency current to flow in a heating coil 107 wound around the induction-heating mount 106 from an AC power supply 108. At that time, since the resistivity of the nonporous single-crystal silicon layer 303 is higher than the resistivity of the silicon substrate 301, the silicon substrate 301 is selectively heated. As a result, a temperature difference is provided between the nonporous single-crystal silicon layer 303 and the silicon substrate 101. Due to this temperature difference, a thermal stress is applied to the porous silicon layer 302. As a result, cracks are produced in the porous silicon layer 302, to separate the nonporous single-crystal silicon layer 103 from the silicon substrate 101. In the third embodiment, also, as in the first embodiment, a tensile force, a compressive force, a shearing force, or a pressure or a hydrostatic pressure by a fluid may also be applied to the porous silicon layer 102 as separation assisting means.

As shown in FIG. 3E, a residue 302a of the porous silicon layer 302 sometimes remains on the separated nonporous single-crystal silicon layer 303. In addition, a residue 202b of the porous silicon layer 302 also sometimes remains on the silicon substrate 301 from which the nonporous single-crystal silicon layer 303 has been separated. Such a residue 202a or 202b may also be removed by etching, if necessary, as in the first embodiment.

Figure 3F:
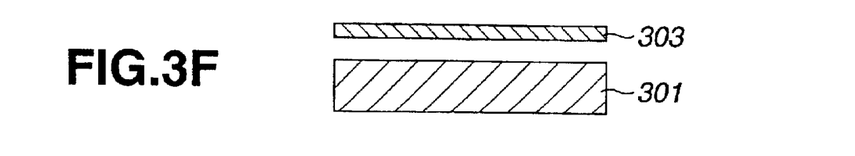

Thus, as shown in FIG. 3F, the nonporous single-crystal silicon layer 303 and the silicon substrate 301 are obtained. The nonporous single-crystal silicon layer 303 is used, for example, for manufacturing a semiconductor device, such as a solar cell or the like. On the other hand, the silicon substrate 301 can be reutilized for preparing another first member, as in the first embodiment. That is, by using the silicon substrate 301 shown in FIG. 3F, another nonporous single-crystal silicon layer 303 can again be manufactured according to the processing shown in FIGS. 3A–3E.

FIGS. 4A–4F are schematic cross-sectional views illustrating a method for manufacturing a semiconductor film according to a fourth embodiment of the present invention. In FIGS. 4A–4F, the same components as those in FIGS. 1A–1F are indicated by the same reference numerals, and further description thereof will be omitted.

Figure 4A:
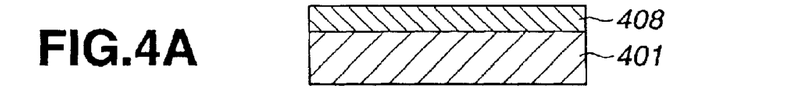
FIGS. 4A–4F are schematic cross-sectional views illustrating a method for manufacturing a semiconductor film according to a fourth embodiment of the present invention.

In the fourth embodiment, first, as shown in FIG. 4A, a nonporous single-crystal silicon substrate 401 having a first resistivity is prepared. Then, a nonporous single-crystal silicon layer 408 having a second resistivity is formed on the silicon substrate 401 according to epitaxial growth. The first and second resistivities are set in the same manner as in the third embodiment. A substrate comprising p$^+$-type silicon may, for example, be used as the silicon substrate 401, and a p$^-$-type silicon layer may, for example, be used as the silicon layer 408. The silicon layer 408 is formed according to CVD or liquid deposition.

Figure 4B:
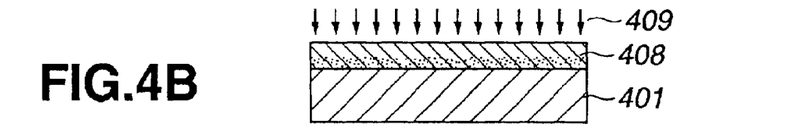

Then, as shown in FIG. 4B, ions 409 of at least one type selected from rare gases, such as hydrogen, nitrogen, helium and the like, are implanted to a predetermined depth from the surface of the silicon layer 408. It is preferable to implant ions such that the projected range, i.e., the region where the concentration distribution of implanted ions is highest, is present within the silicon layer 408 or at the interface between the silicon substrate 401 and the silicon layer 408. On the other hand, when intending to provide a back surface field (BSF) effect in the thin film after separation, ions may be implanted such that the region where the concentration distribution of implanted ions is highest is present within the silicon substrate 401, using a p$^+$-type or n$^+$-type silicon substrate. Before implanting ions, it is preferable to form a protective layer comprising a silicon-oxide layer or the like, on the surface of the silicon substrate 408.

Figure 4C:
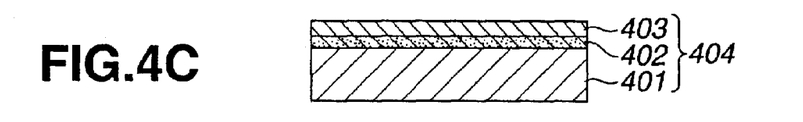

By the ion implantation, as shown in FIG. 4C, an ion-implanted layer 402 is formed except for a silicon layer 403 where ions are not implanted on the surface. The ion-implanted layer 402 operates as a separation layer. A structure in which the silicon layer 403 is formed on the silicon substrate 401 via the ion-implanted layer 402 in the above-described manner serves as a first member 404.

Figure 4D:
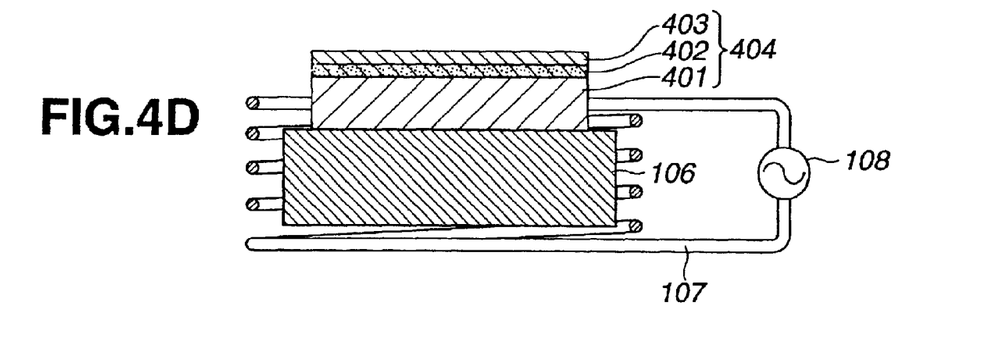

Then, as shown in FIG. 4D, the first member 404 is mounted on an induction-heating mount 106. Although in the fourth embodiment, the silicon substrate 401 faces the induction-heating mount 106, the silicon layer 403 may face the induction-heating mount 106.

Figure 4E:
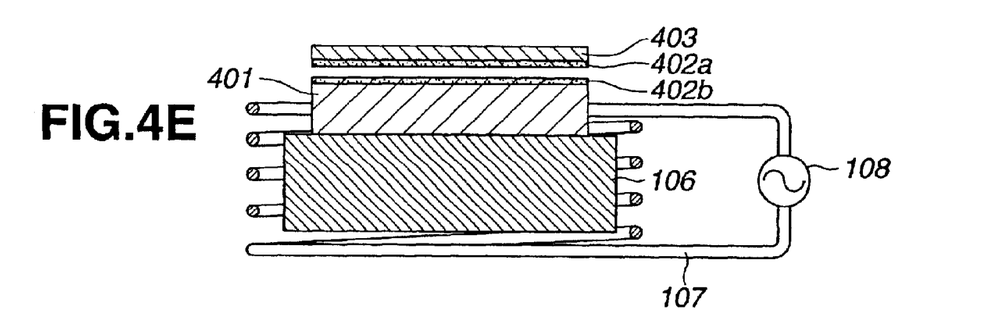

Then, as shown in FIG. 4E, the silicon substrate 401 is heated by induction heating by causing a high-frequency current to flow in a heating coil 107 wound around the induction-heating mount 106 from an AC power supply 108. Since defects and distortion are concentrated in the ion-implanted layer 402, very small bubbles agglomerate by heating at 400–600° C. On the other hand, the silicon layer 403 is hardly heated because the resistivity of the silicon layer 403 is higher than the silicon substrate 401. As a result, a temperature difference is provided between the silicon substrate 401 and the silicon layer 403, and a temperature distribution is provided starting from the ion-implanted layer 402, i.e., the separation layer. Due to this temperature difference, a thermal stress is applied to the ion-implanted layer 402. As a result, cracks are produced in the ion-implanted layer 402, to separate the silicon layer 403 from the silicon substrate 401.

Residues 402a and 402b of the ion-implanted layer 402 sometimes remain on the separated silicon layer 403, and the silicon substrate 401 from which the silicon layer 403 has been separated, respectively. As in the second embodiment, the residues 402a and 402b may be removed by etching, or by smoothing the surfaces of the silicon layer 403 and the silicon substrate 401 by performing annealing after grinding the surfaces.

Figure 4F:
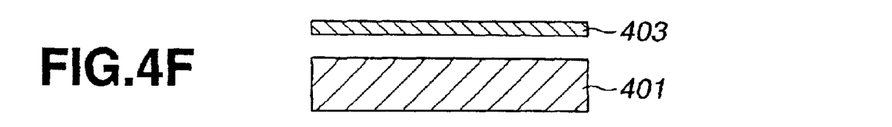

Thus, as shown in FIG. 4F, the silicon layer 403 and the silicon substrate 401 are obtained. The silicon layer 403 is used, for example, for manufacturing a semiconductor device, such as a solar cell or the like. On the other hand, the silicon substrate 401 can be reutilized for preparing another first member, as in the first embodiment. That is, by using the silicon substrate 401 shown in FIG. 4F, another silicon layer 403 can again be manufactured according to the processing shown in FIGS. 4A–4E.

Although in the above-described third and fourth embodiments, the silicon layer is separated by utilizing the difference in the resistivity between the silicon substrate and the silicon layer, a second member whose resistivity is higher than the resistivity of the silicon substrate may also be used together. That is, after attracting the attraction mount 105 described in the first embodiment onto the surface of the silicon layer 303 or 403, the silicon substrate may be heated according to induction heating.

Alternatively, a multilayer structure may be provided by bonding the silicon layer 303 or 403 onto a supporting substrate directly or via an insulating layer, and the multilayer structure may be heated according to induction heating. In this case, the supporting substrate operates as the second member. The silicon substrate or the glass substrate described in the first embodiment may be used as the supporting substrate. When bonding the silicon layer onto the supporting member via the insulating layer, the insulating layer may be formed according to a method similar to the above-described method.

Although in the above-described first through fourth embodiments, the nonporous single-crystal silicon substrate and the nonporous single-crystal silicon layer are used as the semiconductor substrate and the semiconductor layer, respectively, the semiconductor substrate and the semiconductor layer may be formed using any other appropriate materials, provided that a separation layer can be formed.

EXAMPLE 1

A semiconductor film was formed according to the method shown in FIGS. 3A–3F. First, as shown in FIG. 3A, a p$^+$-type nonporous single-crystal silicon substrate (silicon wafer) 301 having a resistivity of 0.02 Ω·cm and a diameter of 3 inches was prepared. This silicon substrate 301 was immersed in a solution obtained by mixing a hydrogen-fluoride (HF) solution and ethanol. After causing a current having a current density of 7 mA/cm$^2$ to flow in the silicon substrate 301 for one minute, a current having a current density of 20 mA/cm$^2$ was caused to flow in the silicon substrate 301 for ten minutes, to form the porous silicon layer 302 shown in FIG. 3B.

Then, the silicon substrate 301 was placed within a CVD apparatus, and annealing was performed at 950° C. by introducing hydrogen gas into the apparatus, to smooth the surface of the porous silicon layer 302. Then, by introducing a source gas into the CVD apparatus, a p$^-$-type nonporous single-crystal silicon layer 303 was formed on the porous silicon layer 302 according to epitaxial growth, to form the first member 304 shown in FIG. 3C. The resistivity of the formed silicon layer 303 measured using a monitor was 1.5 Ω·cm.

Then, as shown in FIG. 3D, the first member 304 was mounted on the induction-heating mount 106, and a current having a frequency of 350 kHz and an output of 2 kW was caused to flow in the heating coil 107 from the AC power supply 108. The silicon substrate 301 was thereby heated to 500° C. in 20 seconds. As a result, a shearing force was generated due to the temperature difference between the silicon substrate 301 and the silicon layer 303, and, as shown in FIG. 3E, the silicon layer 303 was separated from the silicon substrate 301 at the porous silicon layer 302.

By immersing the separated silicon layer 303 in a solution obtained by mixing a hydrogen-fluoride (HF) solution, a hydrogen-peroxide ($H_2O_2$) solution, ethanol and water, a residue 302a of the porous silicon layer 302 remaining on the silicon layer 303 was removed by etching, to obtain the semiconductor layer shown in FIG. 3F, i.e., the nonporous single-crystal silicon layer 303. By also removing a residue 302b of the porous silicon layer 302 remaining on the silicon substrate 301 by etching, the silicon substrate 301 having a smooth surface shown in FIG. 3F was obtained. This silicon substrate 301 could be again used for manufacturing another silicon layer 303 according to the processing shown in FIGS. 3A–3F.

EXAMPLE 2

A solar cell was manufactured according to a method to be described with reference to the schematic cross-sectional views shown in FIGS. 5A–5G. In FIGS. 5A–5G, the same components as those shown in FIGS. 1A–1F are indicated by the same reference numerals, and further description thereof will be omitted.

Figure 5A:
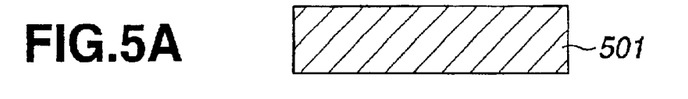
FIGS. 5A–5G are schematic cross-sectional views illustrating a method for manufacturing a solar cell according to the present invention.
Figure 5B:
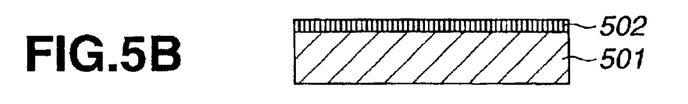
Figure 5C:
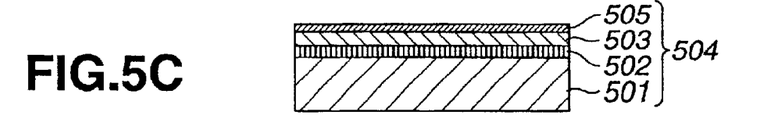

First, as shown in FIG. 5A, a $p^+$-type nonporous single-crystal silicon substrate (silicon wafer) 501 having a resistivity of 0.01 Ω·cm and a diameter of 4 inches was prepared. This silicon substrate 501 was immersed in a solution obtained by mixing a hydrogen-fluoride (HF) solution and ethanol. After causing a current having a current density of 8 mA/cm$^2$ to flow in the silicon substrate 301 for one minute, a current having a current density of 20 mA/cm$^2$ was caused to flow in the silicon substrate 501 for ten minutes, to form a porous silicon layer 502 shown in FIG. 5B. The porous silicon layer 502 included two porous layers having different porosities.

Then, the silicon substrate 501 was annealed in a hydrogen atmosphere to smooth the surface of the porous silicon layer 502. Then, a $p^-$-type nonporous single-crystal silicon layer 503 having a thickness of 50 μm and an $n^-$-type nonporous single-crystal silicon layer 505 having a thickness of 0.2 μm were sequentially formed on the porous silicon layer 502 according to liquid deposition, to provide a first member 504 shown in FIG. 5C.

Figure 5D:
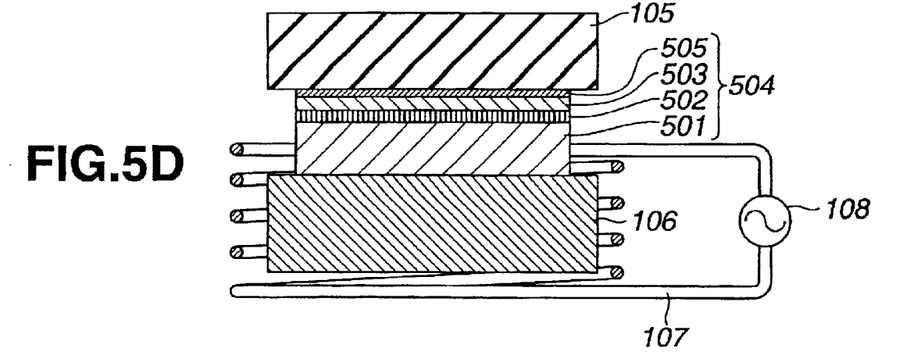

Then, as shown in FIG. 5D, after attracting the silicon layer 505 of the first member 504 onto an attraction mount 105, the first member 504 was mounted on an induction-heating mount 106. The attraction mount 105 had a cooling mechanism for causing cooled nitrogen gas to flow within a mounted pipe.

Figure 5E:
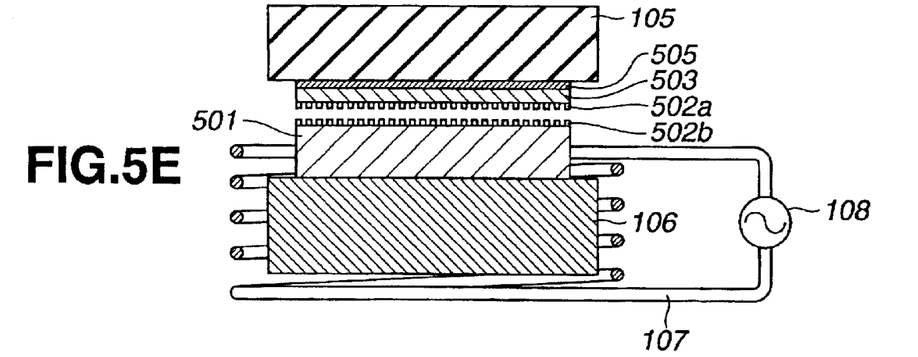

Then, the silicon substrate 501 was selectively heated by causing a current having a frequency of 500 kHz and an output of 5 kW to flow in a heating coil 107 from an AC power supply 108. At the same time, the silicon layers 505 and 503 were cooled by the cooling mechanism of the attraction mount 105. The temperature difference between the silicon substrate 501, and the silicon layers 505 and 503 reached 500° C. in 10 seconds. As a result, the porous silicon layer 502 was destructed by a shearing force generated due to a difference in thermal expansion at the porous silicon layer 502, and, as shown in FIG. 5E, the silicon layers 505 and 503 were separated from the silicon substrate 501.

Figure 5F:
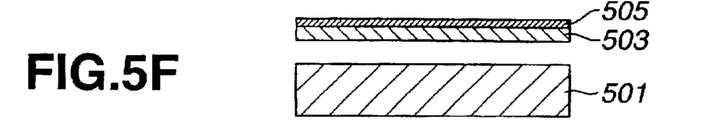

By immersing the separated silicon layers 505 and 503 in a solution obtained by mixing a hydrogen-fluoride (HF) solution, a hydrogen-peroxide ($H_2O_2$) solution, ethanol and water, a residue 502a of the porous silicon layer 502 remaining on the silicon layer 503 was removed by etching, to obtain a semiconductor layer shown in FIG. 5F, i.e., a laminated structure comprising the $p^-$-type silicon layer 503 and the $n^-$-type silicon layer 505 was obtained. By also removing a residue 502b of the porous silicon layer 502 remaining on the silicon substrate 501 by etching, a silicon substrate 501 having a smooth surface shown in FIG. 5F was obtained. This silicon substrate 501 could be again used for manufacturing another solar cell according to the processing shown in FIGS. 5A–5F.

Figure 5G:
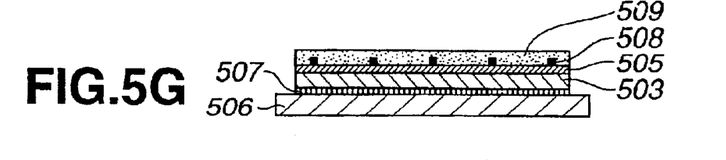

As shown in FIG. 5G, by performing heat welding of the $p^-$-type silicon layer 503 of the laminated structure obtained in the above-described manner onto an aluminum plate 506, serving as an electrode as well as a supporting member, and simultaneously diffusing aluminum into the $p^-$-type silicon layer 503, a $p^+$-type silicon layer 507 was formed. Then, by forming an antireflection layer 509 after forming current collecting electrodes 508 on the $n^-$-type silicon layer 505, a thin-film solar cell shown in FIG. 5G was manufactured.

Although in Example 2, the residue 502a on the $p^-$-type silicon layer 503 was removed, it is only necessary to perform such processing if necessary. Such processing may not be performed if a solar cell can be manufactured even if the residue 502a remains.

EXAMPLE 3

An SOI substrate was manufactured according to a method to be described with reference to the schematic cross-sectional views shown in FIGS. 6A–6G. In FIGS. 6A–6G, the same components as those shown in FIGS. 1A–1F are indicated by the same reference numerals, and further description thereof will be omitted.

Figure 6A:
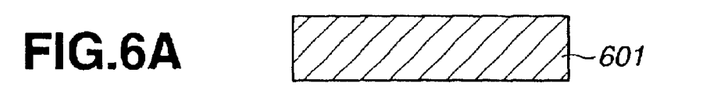
FIGS. 6A–6G are schematic cross-sectional views illustrating a method for manufacturing an SOI substrate according to the present invention.
Figure 6B:
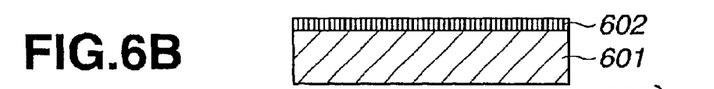
Figure 6C:
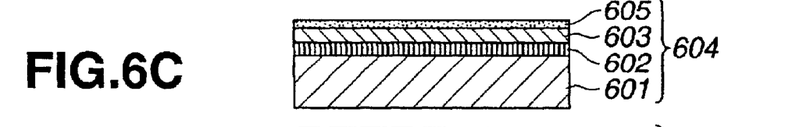

First, as shown in FIG. 6A, a $p^+$-type nonporous single-crystal silicon substrate (silicon wafer) 601 having a resistivity of 0.01 Ω·cm and a diameter of 5 inches was prepared. This silicon substrate 601 was immersed in a solution obtained by mixing a hydrogen-fluoride (HF) solution and ethanol. After causing a current having a current density of 7 mA/cm$^2$ to flow in the silicon substrate 601 for five minutes, a current having a current density of 30 mA/cm$^2$ was caused to flow in the silicon substrate 601 for ten minutes, to form a porous silicon layer 602 having a thickness of 5 μm shown in FIG. 6B. The porous silicon layer 602 included two porous layers having different porosities.

Then, by heating the silicon substrate 601 on which the porous silicon layer 602 was formed in an oxygen atmosphere at 400° C. for one hour, an silicon-oxide film was formed on the inner walls of pores and the surface of the porous silicon layer 602. Then, only the silicon-oxide layer on the surface of the porous silicon layer 602 was removed by processing the surface of the porous silicon layer 602 with a hydrogen fluoride (HF) solution.

The silicon substrate 601 was then placed within a CVD apparatus, and annealing was performed at 950° C. by introducing hydrogen gas into the apparatus, to smooth the surface of the porous silicon layer 602. By introducing a source gas into the CVD apparatus, a p-type nonporous single-crystal silicon layer 603 having a thickness of 0.3 μm was formed on the porous silicon layer 602 according to epitaxial growth. The resistivity of the formed silicon layer 603 measured using a monitor was 10 Ω·cm. Then, the surface of the silicon layer 603 was thermally oxidized to form a silicon-oxide layer 605 having a thickness of 100 nm as an insulating layer. Thus, a first member 604 shown in FIG. 6C was formed.

Figure 6D:
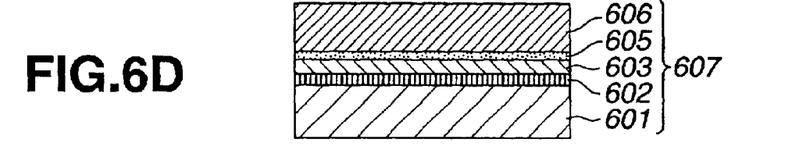

Then, after activating the surface of the silicon-oxide layer 605 by projecting nitrogen ($N_2$) plasma thereon, the silicon-oxide layer 605 was tightly superposed on a separately prepared silicon substrate (silicon wafer) 606, as shown in FIG. 6D. The first member 604 and the silicon substrate 606 were bonded together by performing heat treatment of the integrated structure at 600° C. for three hours, to obtain a laminated structure 607.

Figure 6E:
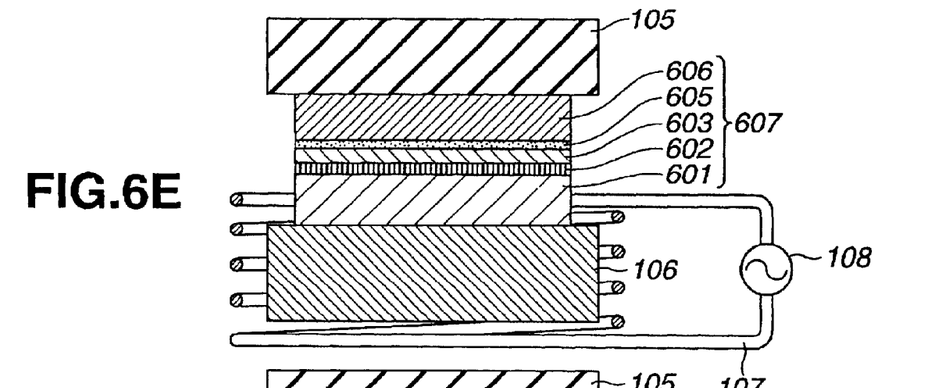

Then, as shown in FIG. 6E, after attracting the silicon substrate 606 of the laminated structure 607 onto an attraction mount 105 having a water-cooling mechanism, the laminated structure 607 was mounted on an induction-heating mount 106. Then, the silicon substrate 601 was selectively heated by causing a current having a frequency of 700 kHz and an output of 10 kW to flow in a heating coil 107 from an AC power supply 108. At the same time, the silicon substrate 606 was cooled by the cooling mechanism of the attraction mount 105. The temperature difference between the silicon substrate 601 and the silicon layer 603 reached 550° C. in 20 seconds. As a result, the porous silicon layer 602 was destructed by a shearing force generated due to a difference in thermal expansion at the porous silicon layer 602, and, as shown in FIG. 6F, the silicon layer 603 was separated from the silicon substrate 601, and was transferred on the silicon substrate 606 via the silicon-oxide layer 605.

By immersing the silicon substrate 606, on which the silicon layer 603 was transferred, in a solution obtained by mixing a hydrogen-fluoride (HF) solution, a hydrogen-peroxide ($H_2O_2$) solution, ethanol and water, a residue 602a of the porous silicon layer 602 remaining on the silicon layer 603 was removed by etching. Then, by annealing the silicon substrate 606 on which the silicon layer 603 was transferred in a reductive atmosphere including hydrogen at 1,100° C. for one hour, the surface of the silicon layer 603 was smoothed. Thus, as shown in FIG. 6G, an SOI substrate 608 having the single-crystal silicon layer 603 on the silicon substrate 606 via the silicon-oxide layer 605 was manufactured.

Figures 6F, 6G:
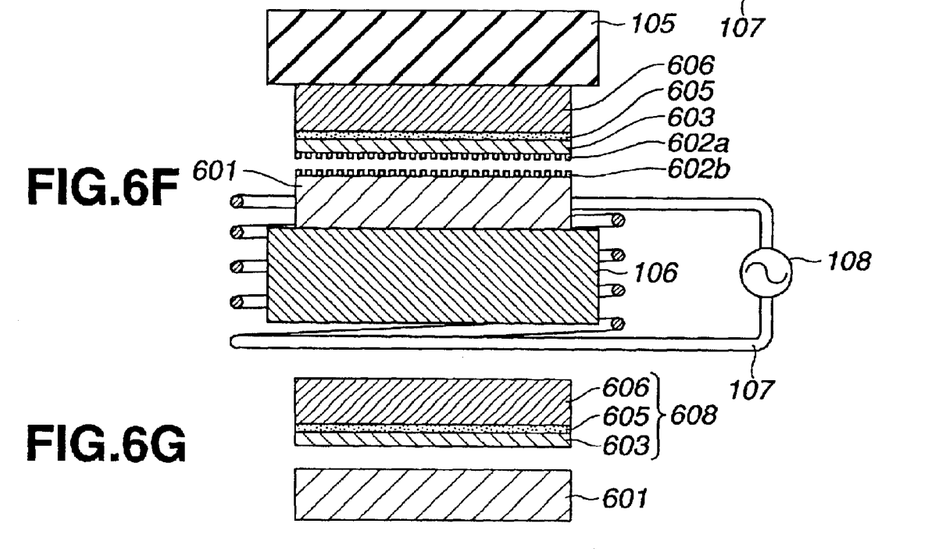

By also removing a residue 602b of the porous silicon layer 602 remaining on the silicon substrate 601 by etching, the silicon substrate 601 having a smooth surface shown in FIG. 6G was obtained. This silicon substrate 601 could be again used for manufacturing another SOI substrate according to the processing shown in FIGS. 6A–6G.

EXAMPLE 4

A solar cell was manufactured according to another method to be described below. In the description the same components as those shown in FIGS. 1A–1F are indicated by the same name, and further description thereof will be omitted.

First, a $p^+$-type nonporous single-crystal silicon substrate (silicon wafer) having a resistivity of 0.01 Ω·cm and a diameter of 4 inches was prepared. Then, a $p^-$-type nonporous single-crystal silicon layer having a resistivity of 2 Ω·cm and a thickness of 1.2 μm and an $n^+$-type nonporous single-crystal silicon layer having a thickness of 0.2 μm were sequentially formed on the silicon substrate according to epitaxial growth by CVD. Then, hydrogen ions with energy of 450 eV were implanted from the side of the $n^+$-type silicon layer to a concentration of $7.0 \times 10^{16}/cm^2$, to form an ion-implanted layer to a depth of about 2 μm from the surface of then +-type silicon layer. Then, a first member, in which the ion-implanted layer, a surface $p^+$layer of the silicon substrate where ions were not implanted, the $p^-$-type silicon layer and the $n^+$-type silicon layer are sequentially laminated, was formed on a remaining portion of the silicon substrate.

Then, after attracting the $n^+$-type silicon layer of the first member onto an attraction mount 105 having a cooling mechanism, the first member was mounted on an induction-heating mount 106. The attraction mount 105 had a cooling mechanism for causing cooled nitrogen gas to flow within a mounted pipe. Then, the silicon substrate was selectively heated by causing a current having a frequency of 450 kHz and an output of 3 kW to flow in a heating coil 107 from an AC power supply 108, while cooling the $n^+$-type silicon layer, the $p^-$-type silicon layer, and the surface $p^+$layer of the silicon substrate by the cooling mechanism of the attraction mount 105. As a result, very small bubbles agglomerated within the ion-implanted layer by the heating, and the temperature difference between the remaining portion of the silicon substrate, and the $n^+$-type silicon layer, the $p^-$-type silicon layer and the surface $p^+$layer reached 500° C. in 10 seconds. As a result, cracks were produced in the ion-implanted layer by a shearing force generated due to a difference in thermal expansion at the ion-implanted layer, and, the $n^+$-type silicon layer, the $p^-$-type silicon layer and the surface $p^+$layer were separated from the remaining portion of the silicon substrate.

By removing a residue of the ion-implanted layer from the separated silicon layers by etching, a semiconductor film having a laminated structure comprising the $p^+$layer, the $p^-$-type silicon layer and the $n^+$-type silicon layer was obtained. By also removing a residue of the ion-implanted layer remaining on the remaining silicon substrate by etching, a silicon substrate having a smooth surface was obtained. This silicon substrate could be again used for manufacturing another solar cell according to the above-described processing.

By coating a conductive adhesive on the $p^+$-type silicon layer of the laminated structure obtained in the above-described manner, the laminated structure was bonded on a supporting substrate made of stainless steel. Then, by forming an antireflection layer after forming current collecting electrodes on the $n^+$-type silicon layer, a thin-film solar cell was manufactured. In this solar cell, the back surface (BSF) effect was obtained due to the $p^+$-type silicon layer.

The individual components shown in outline in the drawings are all well known in the semiconductor-film manufacturing arts, and their specific construction and operation are not critical to the operation or the best mode for carrying out the invention.

While the present invention has been described with respect to what are presently considered to be the preferred embodiments, it is to be understood that the invention is not limited to the disclosed embodiments. To the contrary, the present invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A method for manufacturing a semiconductor film comprising the steps of:

preparing a first member including a semiconductor substrate, a semiconductor layer whose resistivity is higher than a resistivity of the semiconductor substrate, and a separation layer provided between the semiconductor substrate and the semiconductor layer; and separating the semiconductor layer from the semiconductor substrate at the separation layer by heating the first member by induction heating, wherein said step for preparing the first member comprises a step of forming a porous silicon layer, serving as a separation layer, by anodizing a surface of a $p^+$-type nonporous silicon substrate, and a step of forming a $p^-$-type nonporous silicon layer on the porous silicon layer according to epitaxial growth.

2. A method for manufacturing a semiconductor film comprising the steps of:

preparing a first member including a semiconductor substrate, a semiconductor layer whose resistivity is higher than a resistivity of the semiconductor substrate, and a separation layer provided between the semiconductor substrate and the semiconductor layer; and separating the semiconductor layer from the semiconductor substrate at the separation layer by heating the first member by induction heating, wherein said step for preparing the first member comprises a step of forming a $p^-$-type silicon layer on a $p^+$-type silicon substrate according to epitaxial growth, and forming an ion-implanted layer, serving as a separation layer, except for a $p^-$-type silicon layer where ions are not implanted on a surface thereof, by implanting at least one type of ions selected from hydrogen, nitrogen and helium to a predetermined depth from a surface of the $p^-$-type silicon layer.

3. A method according to claim 2, wherein said step of preparing the first member further comprises a step of forming a protective film on the surface of the $p^-$-type silicon layer before implanting the ions.

* * * * *

UNITED STATES PATENT AND TRADEMARK OFFICE
CERTIFICATE OF CORRECTION

PATENT NO. : 6,720,237 B2
DATED : April 13, 2004
INVENTOR(S) : Yukiko Iwasaki et al.

It is certified that error appears in the above-identified patent and that said Letters Patent is hereby corrected as shown below:

Column 2,
Line 30, "(3)" should be deleted.

Column 12,
Line 59, "an" should read -- a --.

Signed and Sealed this

Twenty-first Day of December, 2004

JON W. DUDAS
*Director of the United States Patent and Trademark Office*